United States Patent
Jung

(10) Patent No.: US 9,575,374 B2
(45) Date of Patent: Feb. 21, 2017

(54) LIQUID CRYSTAL DISPLAY DEVICE AND METHOD OF MANUFACTURING THE SAME

(71) Applicant: LG DISPLAY CO., LTD., Seoul (KR)

(72) Inventor: Sung Hun Jung, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 182 days.

(21) Appl. No.: 14/013,248

(22) Filed: Aug. 29, 2013

(65) Prior Publication Data

US 2014/0063394 A1   Mar. 6, 2014

(30) Foreign Application Priority Data

Aug. 30, 2012   (KR) .................. 10-2012-0095798

(51) Int. Cl.
  *G02F 1/1343*   (2006.01)
  *G02F 1/1362*   (2006.01)
  *H01L 27/02*   (2006.01)

(52) U.S. Cl.
  CPC ... *G02F 1/134309* (2013.01); *G02F 1/136204* (2013.01); *H01L 27/0296* (2013.01); *G02F 2201/122* (2013.01); *H01L 2924/0002* (2013.01)

(58) Field of Classification Search
  CPC .............. G02F 1/136204; G02F 1/1345; G02F 1/13452; G02F 1/13454; G02F 2001/13456; G02F 1/13458
  See application file for complete search history.

(56) References Cited

U.S. PATENT DOCUMENTS

| | | | |
|---|---|---|---|
| 2005/0270467 A1* | 12/2005 | Lee | ............... 349/152 |
| 2008/0143640 A1 | 6/2008 | Hsu et al. | |
| 2008/0151167 A1* | 6/2008 | Aota et al. | .................... 349/139 |
| 2010/0123864 A1* | 5/2010 | Sugiyama et al. | ............ 349/138 |
| 2013/0002977 A1* | 1/2013 | Park | .................. G02F 1/133308 349/58 |
| 2013/0027626 A1* | 1/2013 | Namiki | ............. G02F 1/136204 349/43 |

FOREIGN PATENT DOCUMENTS

| | | |
|---|---|---|
| CN | 101211050 A | 7/2008 |
| JP | 2008-145686 A | 6/2008 |
| JP | 2008-152225 A | 7/2008 |
| KR | 10-2011-0035145 A | 4/2011 |

OTHER PUBLICATIONS

Office Action dated Jan. 11, 2014, issued by the Korean Intellectual Property Office in Korean Patent Application No. 10-2012-0095798.

Chinese Office Action dated Oct. 9, 2015, in Chinese Patent Application No. 201310389760.1.

* cited by examiner

*Primary Examiner* — Jessica M Merlin
(74) *Attorney, Agent, or Firm* — Morgan, Lewis & Bockius LLP

(57) ABSTRACT

A liquid crystal display device and method of manufacturing a liquid crystal display device are provided. The liquid crystal display device includes: a thin film transistor substrate, a color filter substrate on the thin film transistor substrate, a transparent conductive plate on the color filter substrate, a pad portion on the thin film transistor substrate, a static-electricity transmission electrode on a region of the pad portion adjacent to the color filter substrate, a conductive member configured to electrically connect the transparent conductive plate and the static-electricity transmission electrode to each other, and a plurality of lattice patterns on the static-electricity transmission electrode.

18 Claims, 6 Drawing Sheets

LIQUID CRYSTAL DISPLAY DEVICE AND METHOD OF MANUFACTURING THE SAME

CROSS REFERENCE TO RELATED APPLICATION(S)

This application claims the benefit under 35 U.S.C. §119 (a) of Korean Patent Application No. 10-2012-0095798, filed on Aug. 30, 2012, the entire disclosure of which is incorporated by reference herein for all purposes.

BACKGROUND

1. Technical Field

The present application relates to a liquid crystal display device and method of manufacturing the same.

2. Discussion of the Related Art

As the information society spreads, the requirements for display devices are varied and gradually increasing. In accordance therewith, a variety of display devices such as liquid crystal display (LCD) devices, plasma display panels (PDP), electro-luminescent display (ELD) devices, vacuum fluorescent display (VFD) devices, and so on, have been researched. Furthermore, some display devices already have been applied to many appliances and devices.

More specifically, the LCD devices are rapidly replacing cathode ray tubes (CRTs) and are used most often as a portable image (or picture) display device, because they have features such as superior picture quality, light weight, slimness, low power consumption, and so on. These LCD devices are being developed in a variety of shapes which are applied to computer monitors, television display screens, and so on, as well as to portable notebook computer monitors.

In this manner, many technologies allowing the LCD device to be used in a variety of fields as an image display device had been developed. However, technologies for enhancing image quality of the LCD device can affect realization of the above-mentioned features.

In order to apply the LCD device to a variety of fields as a general image display device, the LCD device must display high quality images while realizing the features of light weight, slimness, and low power consumption. In other words, the LCD device must further provide the features of high definition, high brightness, large size, and so on.

For reference, the configuration of a related art LCD device will now be briefly described with reference to FIG. 1.

FIG. 1 is a cross-sectional view showing an LCD device of the related art.

With reference to FIG. 1, the related art LCD device includes an LCD panel 310 configured with a thin film transistor substrate 311 and a color filter substrate 321.

The LCD panel 310 may be received into and fastened to a bottom cover 313. A transparent conductive plate 323 may be formed on the color filter substrate 321. A static-electricity prevention tape 331 is connected between the bottom cover 313 and the transparent conductive plate 323. Static-electricity generated in the manufacturing process of the LCD device and during the use of the LCD device can apply a large amount of energy to the LCD device within a short period (several tens of nanoseconds). Due to this, elements (for example, thin film transistors) included in the LCD device may be seriously damaged. The static-electricity being generated in the manufacturing process of the LCD device and during the use of the LCD device may be discharged toward the exterior via the transparent conductive plate 323, the static-electricity prevention tape 331, and the bottom cover 313.

A recent trend of a thin LCD device forces a bezel portion to be narrowed. As such, the margin of the static-electricity prevention tape 331 being used to discharge static-electricity is gradually reduced. Due to this, a process yield can decrease and a fault generation ratio may become higher.

SUMMARY

Accordingly, embodiments of the present application are directed to a liquid crystal display (LCD) device and method of manufacturing the same that substantially obviates one or more of problems due to the limitations and disadvantages of the related art.

An object of embodiments is to provide an LCD device which is adapted to become thinner and lighter by reducing the area of a pad portion.

Advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose according to one aspect of the invention, there is provided an LCD device, including: a thin film transistor substrate, a color filter substrate on the thin film transistor substrate, a transparent conductive plate on the color filter substrate, a pad portion on the thin film transistor substrate, a static-electricity transmission electrode on a region of the pad portion adjacent to the color filter substrate, a conductive member configured to electrically connect the transparent conductive plate and the static-electricity transmission electrode to each other, and a plurality of lattice patterns on the static-electricity transmission electrode.

In another aspect, there is provided a method of manufacturing a liquid crystal display device, the method including: forming a thin film transistor substrate, forming a color filter substrate on the thin film transistor substrate, forming a transparent conductive plate on the color filter substrate, forming a pad portion on the thin film transistor substrate, forming a static-electricity transmission electrode on a region of the pad portion adjacent to the color filter substrate, forming a conductive member to electrically connect the transparent conductive plate and the static-electricity transmission electrode to each other, and forming a plurality of lattice patterns formed on the static-electricity transmission electrode.

It is to be understood that both the foregoing general description and the following detailed description are examples and explanatory and are intended to provide further explanation of embodiments of the invention as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the invention.

Figure 1:
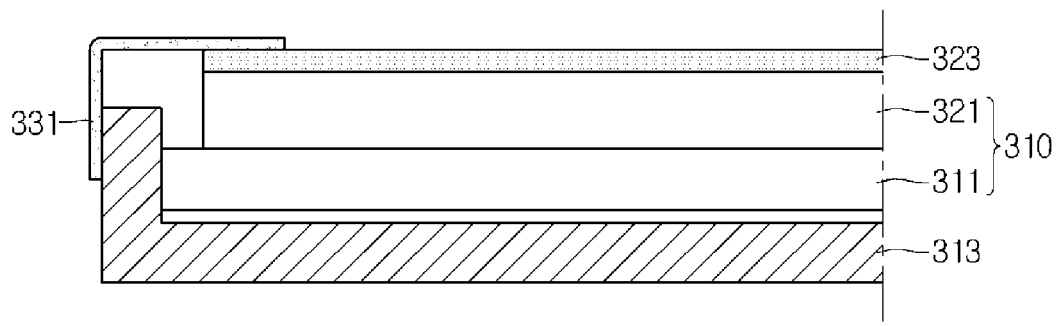
FIG. 1 is a cross-sectional view showing an LCD device of the related art.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present invention, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In description of embodiments of the present invention, when a structure is described as being positioned "on or above" or "under or below" another structure, this description should be construed as including a case in which the structures contact each other as well as a case in which a third structure is disposed therebetween.

An LCD device according to an embodiment may include: a thin film transistor substrate, a color filter substrate on the thin film transistor substrate, a transparent conductive plate on the color filter substrate, a pad portion on the thin film transistor substrate, a static-electricity transmission electrode on a region of the pad portion adjacent to the color filter substrate, a conductive member configured to electrically connect the transparent conductive plate and the static-electricity transmission electrode to each other, and a plurality of lattice patterns on the static-electricity transmission electrode.

The static-electricity transmission electrode may be formed, for example, in the same layer as pixel electrodes of the thin film transistor substrate.

The static-electricity transmission electrode may be formed, for example, from one of indium-tin-oxide (ITO), indium-zinc-oxide (IZO), and indium-tin-zinc-oxide (ITZO).

The LCD device may further include a flexible circuit substrate configured to transfer external signals to the thin film transistor substrate, and a connector configured to connect the flexible circuit substrate to the thin film transistor substrate.

The static-electricity transmission electrode may be connected, for example, to the flexible circuit substrate via the connector.

The conductive member may be formed, for example, using silver (Ag).

The plurality of lattice patterns may be formed in a region of the static-electricity transmission electrode adjacent to the color filter substrate.

The plurality of lattice patterns may be formed only in a region of the static-electricity transmission electrode contacting the conductive member.

The static-electricity transmission electrode can include a protrusion with a first height and an intaglio having a bottom layer with a thickness corresponding to a second height.

The first height may be greater than the second height.

The static-electricity transmission electrode may further be formed at least partially on the pad portion.

Figure 2:
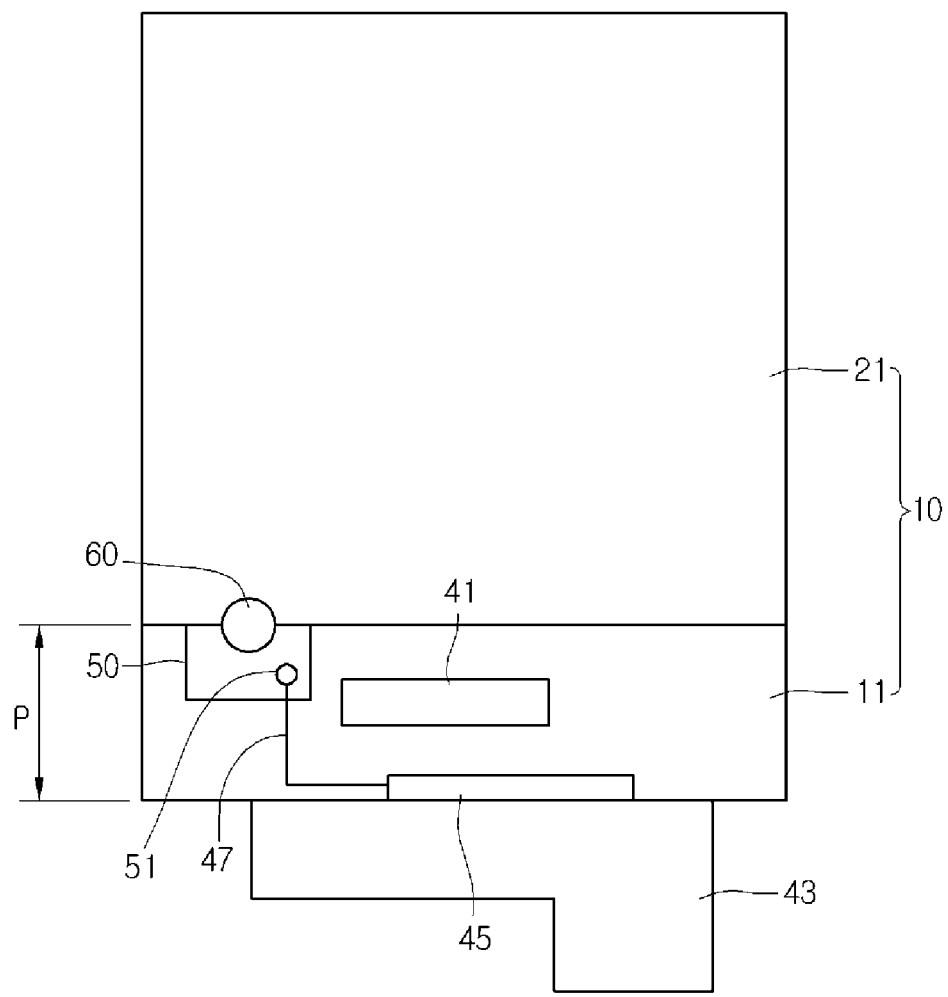
FIG. 2 is a planar view showing an LCD device according to an embodiment.

FIG. 2 is a planar view showing an LCD device according to an embodiment.

With reference to FIG. 2, the LCD device according to an embodiment may include an LCD panel 10. The LCD panel 10 may include a thin film transistor substrate 11 and a color filter substrate 21.

A plurality of gate lines may be formed to extend in a first direction on the thin film transistor substrate 11, and a plurality of data lines may be formed to extend in a second direction perpendicular to the gate lines. A plurality of pixel regions may be defined where the gate and data lines cross each other. A thin film transistor may be formed on each pixel region.

Red, blue, and green color filters and a black matrix may be on the color filter substrate 21.

A liquid crystal layer may be interposed between the thin film transistor substrate 11 and the color filter substrate 21. Molecules of the liquid crystal layer are realigned by an electrical field, which is applied to the liquid crystal layer via the data line and the thin film transistor, and control the transmittance of light in order to display an image.

The thin film transistor substrate 11 may be formed to have a larger size than that of the color filter substrate 21. As such, the thin film transistor substrate 11 may have a pad portion P. The pad portion P may be defined as an area of the thin film transistor substrate 11 not overlapping with the color filter substrate 21.

A flexible circuit substrate 43 may be connected to the pad portion P. A driver integrated-circuit (IC) 41, a connector 45, a static-electricity transmission electrode 50, and a connection line 47 may be formed on the pad portion P. The flexible circuit substrate 43 may be connected to the thin film transistor substrate 11 through the connector 45. The connector 45 may be electrically connected to the driver IC 41 through internal wirings.

The flexible circuit substrate 43 may transfer external signals to the driver IC 41 through the connector 45. Such a flexible circuit substrate 43 may be formed from a material which may be easily bent and folded.

The driver IC 41 may transfer the signals, which may be received from the flexible circuit substrate 43, to the gate and data lines on the thin film transistor substrate 11. Such a driver IC 43 may include gate and data drivers.

The static-electricity transmission electrode 50 may be formed from the same material as a pixel electrode which may be connected to the thin film transistor. Also, the static-electricity transmission electrode 50 may be disposed in the same layer as the pixel electrode which may be connected to the thin film transistor. Such a static-electricity transmission electrode 50 may be formed from one of indium-tin-oxide (ITO), indium-zinc-oxide (IZO), and indium-tin-zinc-oxide (ITZO).

A conductive member 60 may be disposed in a boundary region between the static-electricity transmission electrode 50 and the color filter substrate 21. The conductive member 60 may be formed using silver (Ag). The material is not limited thereto.

The static-transmission electrode 50 may be electrically connected to the connector 45 via the connection line 47. Also, the static-electricity electrode 50 may be electrically connected to the connection line 47 through a contact hole 51. The connection line 47 may be formed from the same material as the gate and data lines of the thin film transistor substrate 11.

A static-electricity generated in the entire surface of the color filter substrate 21 may be discharged toward the exterior via the conductive member 60, the static-electricity transmission electrode 50, the connection line 47, the connector 45 and the flexible circuit substrate 43.

Although it is explained that the static-electricity transmission electrode 50 is formed in a left side region adjacent to the driver IC 41 as shown in the drawing, this is only an example. As such, the position of the static-electricity transmission electrode 50 is not limited to the location shown in the drawing. Alternatively, the static-electricity transmission electrode 50 may be formed in a right side region adjacent to the driver IC 41, or another location.

In addition, a plurality of static-electricity transmission electrodes 50 may be formed in the left and right side regions with the driver IC 41 therebetween. The plurality of static-electricity transmission electrodes 50 may enable static-electricity to be smoothly discharged. In one example, a plurality of conductive members may be formed.

Figure 3:
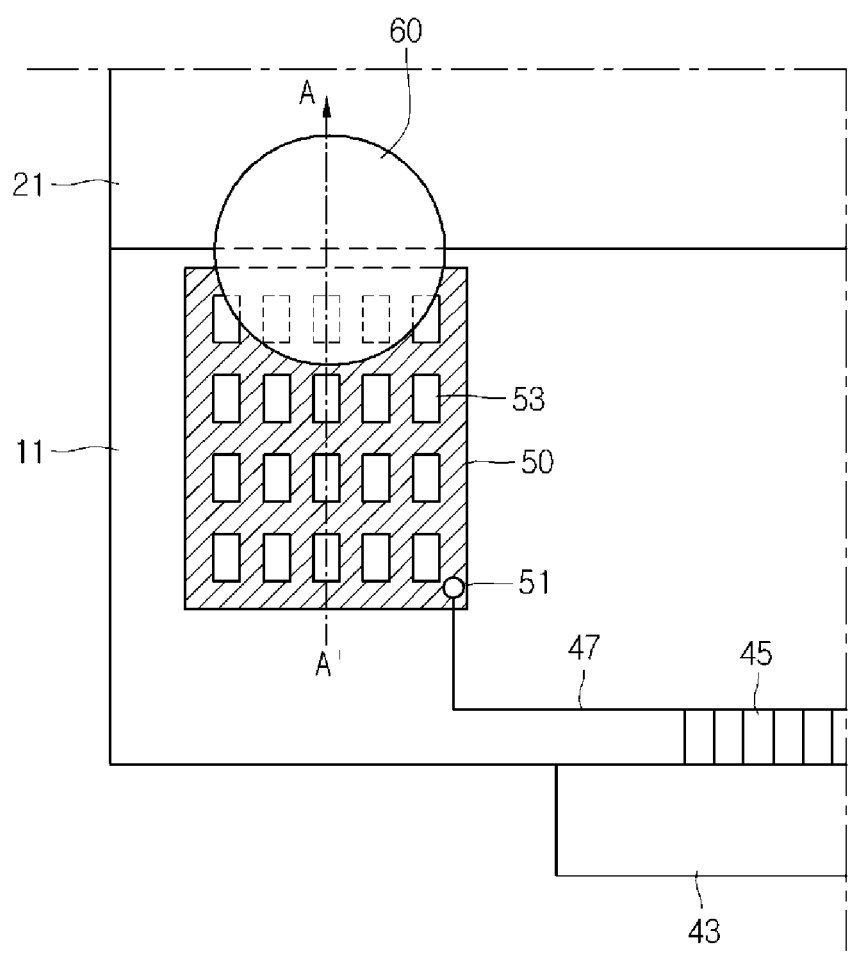
FIG. 3 is an enlarged planar view showing a pad portion of the LCD device according to an embodiment.
Figure 4:
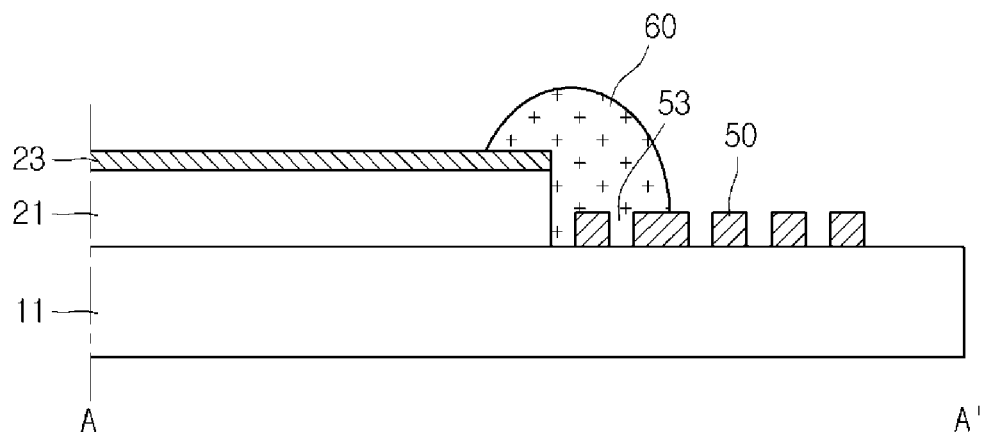
FIG. 4 is a cross-sectional view showing the LCD device taken along a line A-A' in FIG. 3.

FIG. 3 is an enlarged planar view showing a pad portion of the LCD device according to an embodiment. FIG. 4 is a cross-sectional view showing the LCD device taken along a line A-A' in FIG. 3.

With reference to FIGS. 3 and 4, the static-electricity transmission electrode 50, the connector 45, and the connection line 47 may be formed in the pad portion of the LCD device in accordance with an embodiment.

The LCD panel may include the thin film transistor substrate 11 and the color filter substrate 21. A transparent conductive plate 23 may be formed on the color filter substrate 21. The transparent conductive plate 23 may be formed from a transparent conductive metal material. Also, the transparent conductive plate 23 may be formed from the same material as the static-electricity transmission electrode 50. For example, the transparent conductive plate 23 may be formed from one of indium-tin-oxide (ITO), indium-zinc-oxide (IZO), and indium-tin-zinc-oxide (ITZO).

The transparent conductive plate 23 may be used to discharge static-electricity on the color filter substrate 21 toward the exterior via the conductive member 60, the static-electricity transmission electrode 50, the connection line 47, and the flexible circuit substrate 43.

The static-electricity transmission electrode 50 may include a plurality of lattice patterns 53. The plurality of lattice patterns 53 may force a contact area between the contact pattern and the static-electricity transmission electrode 50 to become wider. As such, the resistance between the conductive member 60 and the static-electricity transmission electrode 50 may be lowered, and furthermore the static-electricity may be more easily discharged. In accordance therewith, the LCD device may be protected from the static-electricity.

Also, the plurality of lattice patterns decreasing the resistance between the conductive member 60 and the static-electricity transmission electrode 50 may enable an occupation area of the static-electricity transmission electrode 50 for the pad portion P to be reduced. Therefore, the LCD device may become thinner and lighter.

Moreover, the contact area between the conductive member 60 and the static-electricity transmission electrode 50 may become wider by means of the plurality of lattice patterns 53. Accordingly, the conductive member 60 may be stably attached to the static-electricity transmission electrode 50 even if foreign substances are included in the static-electricity transmission electrode 50 during a formation process of the static-electricity transmission electrode.

The plurality of lattice patterns 53 may be formed through the same patterning process as the pixel electrode of the thin film transistor substrate. Also, the plurality of lattice patterns 53 may be formed in a quadrilateral shape, although the shape is not limited thereto. Moreover, the plurality of lattice patterns 53 may be disposed in an exposed area of the thin film transistor substrate.

The plurality of lattice patterns 53 may be formed in the entire surface of the static-electricity transmission electrode 50. As such, a contact defect between the static-electricity transmission electrode 50 and the conductive member 60 due to a process error (e.g., manufacturing error) may be prevented even if the conductive member 60 comes in partial contact with the static-electricity transmission electrode 50.

Figure 5:
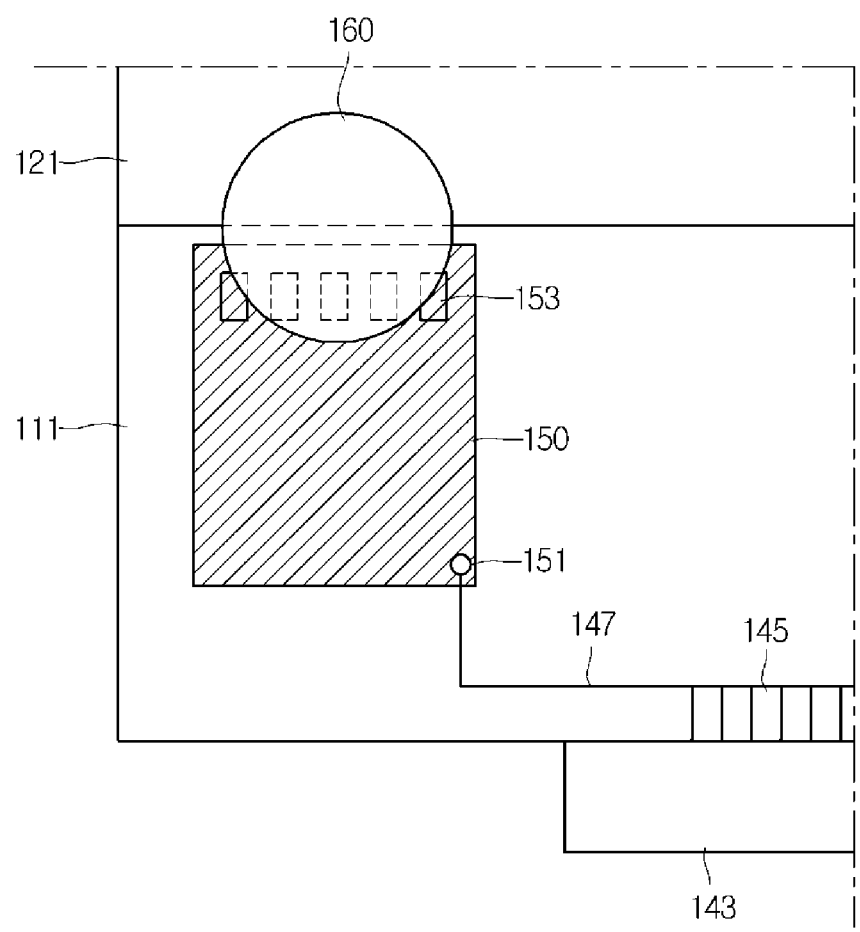
FIG. 5 is a planar view showing a pad portion of an LCD device according to an embodiment.

FIG. 5 is a planar view showing a pad portion of an LCD device according to an embodiment. The LCD device of FIG. 5 may have the same configuration as that of FIGS. 3-4 with the exception of an area of the static-electricity transmission electrode which is occupied by the lattice patterns. As such, the description of FIG. 5 overlapping with FIGS. 3-4 will be omitted for convenience.

With reference to FIG. 5, the LCD device may include a thin film transistor substrate 111 and a color filter substrate 121. The LCD device according to an embodiment may include a static-electricity transmission electrode 150, a connector 145, and a connection line 147 which may be formed in a pad portion. A flexible circuit substrate 143 may be connected to the pad portion P (FIG. 2).

A plurality of lattice patterns 153 may be formed on the static-electricity transmission electrode 150. The plurality of lattice patterns 153 may be formed in a region of the static-electricity transmission electrode 150 adjacent to the color filter substrate 121. For example, the plurality of lattice patterns 153 may be formed in a row on an edge region of the static-electricity transmission electrode 150 adjacent to the color filter substrate 121.

The conductive member 160 may contact a partial upper-surface region of the static-electricity transmission electrode 150 adjacent to the color filter substrate 121. As such, the plurality of lattice patterns may be formed on the partial upper-surface region of the static-electricity transmission electrode 150. In accordance therewith, manufacturing costs of the LCD device may be reduced and a process yield of the LCD device may be enhanced.

Figure 6:
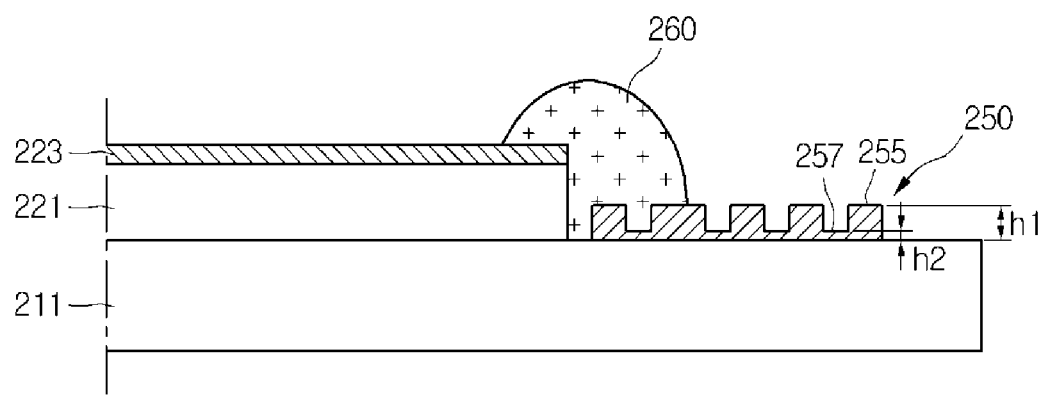
FIG. 6 is a cross-sectional view showing a pad portion of an LCD device according to an embodiment.

FIG. 6 is a cross-sectional view showing a pad portion of an LCD device according to an embodiment. The LCD device of FIG. 6 may have the same configuration as that of FIGS. 3-4 with the exception of a shape of the static-electricity transmission electrode. As such, the description of FIGS. 3-4 embodiment overlapping with FIG. 6 will be omitted for convenience.

With reference to FIG. 6, the LCD device may include a thin film transistor substrate 211 and a color filter substrate 221. A transparent conductive plate 223 may be formed on the color filter substrate 221. The LCD device according to an embodiment may include a static-electricity transmission electrode 250 formed in a pad portion of a thin film transistor substrate 211.

A plurality of lattice patterns may be formed on the static-electricity transmission electrode 250. Also, a plurality of protrusions 255 and a plurality of intaglios 257 may be formed on the static-electricity transmission electrode 250. The intaglios 257 may be formed by partially removing the surface layer of the static-electricity transmission electrode 250 in the lattice patterns using a patterning process. The protrusions 255 may be formed by partially leaving the surface layer of the static-electricity transmission electrode 250 through the lattice patterning process.

The protrusions 255 may be formed to have a first height h1. The static-electricity transmission electrode 250 in the intaglios 257 can have a thickness corresponding to a second height h2. The first height h1 may be larger than the height h2. In other words, the intagliated portion of the static-electricity transmission electrode 250 (or the bottom layer of the intaglios 257) may have the thickness corresponding to the second height h2. As such, the conductive member 260 may come in contact with not only upper and side surfaces of the protrusions 255 but also the bottom surface of the intaglios 257, allowing the contact area between the conductive member 260 and the static-electricity transmission electrode 250 to become wider. In accordance therewith, the resistance between the conductive member 260 and the static-electricity transmission electrode 250 may become lower, and furthermore static-electricity may be more easily discharged. As a result, the LCD device may be protected from static-electricity.

The intaglios 257 each formed in the lattice pattern may enable the resistance between the conductive member 260 and the static-electricity transmission electrode 250 to become lower. Also, the intaglios 257 may allow an occupation area of the static-electricity transmission electrode 250 for the pad portion to be reduced. Therefore, the LCD device may become thinner and lighter.

Although embodiments have been described with reference to a number of illustrative embodiments thereof, it should be understood that numerous other modifications and embodiments may be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A liquid crystal display device, comprising:
a thin film transistor substrate;
a color filter substrate on the a thin film transistor substrate;
a transparent conductive plate on the color filter substrate;
a pad portion on the thin film transistor substrate;
a static-electricity transmission electrode on a region of the pad portion adjacent to the color filter substrate;
a conductive member configured to electrically connect the transparent conductive plate and the static-electricity transmission electrode to each other; and
a plurality of lattice patterns on the static-electricity transmission electrode, a space between at least two of the lattice patterns being filled with the conductive member,
wherein the conductive member directly contacts the thin film transistor substrate between the color filter substrate and the static-electricity transmission electrode,
wherein the plurality of lattice patterns and the conductive member cover only one end of the static-electricity transmission electrode, and
wherein a portion of the static-electricity transmission electrode is not covered by either the plurality of lattice patterns or the conductive member.

2. The liquid crystal display device of claim 1, wherein the plurality of lattice patterns comprises:
a protrusion comprising a first height; and
an intaglio comprising a bottom layer with a thickness corresponding to a second height.

3. The liquid crystal display device of claim 2, wherein the first height is greater than the second height.

4. The liquid crystal display device of claim 1, wherein the static-electricity transmission electrode is in a same layer as pixel electrodes of the thin film transistor substrate.

5. The liquid crystal display device of claim 1, wherein the static-electricity transmission electrode comprises one of indium-tin-oxide (ITO), indium-zinc-oxide (IZO), and indium-tin-zinc-oxide (ITZO).

6. The liquid crystal display device of claim 1, further comprising:
a flexible circuit substrate configured to transfer external signals to the thin film transistor substrate; and
a connector configured to connect the flexible circuit substrate to the thin film transistor substrate.

7. The liquid crystal display device of claim 4, wherein the static-electricity transmission electrode is connected to the flexible circuit substrate via the connector.

8. The liquid crystal display device of claim 1, wherein the conductive member comprises silver (Ag).

9. The liquid crystal display device of claim 1, wherein the plurality of lattice patterns is in a region of the static-electricity transmission electrode adjacent to the color filter substrate.

10. A method of manufacturing a liquid crystal display device, the method comprising:
forming a thin film transistor substrate;
forming a color filter substrate on the thin film transistor substrate;
forming a transparent conductive plate on the color filter substrate;
forming a pad portion on the thin film transistor substrate;
forming a static-electricity transmission electrode on a region of the pad portion adjacent to the color filter substrate;
forming a conductive member to electrically connect the transparent conductive plate and the static-electricity transmission electrode to each other; and
forming a plurality of lattice patterns on the static-electricity transmission electrode, such that the conductive member flows into a space between at least two of the plurality of lattice patterns,
wherein the conductive member directly contacts the thin film transistor substrate between the color filter substrate and the static-electricity transmission electrode,
wherein the plurality of lattice patterns and the conductive member cover only one end of the static-electricity transmission electrode, and wherein a portion of the static-electricity transmission electrode is not covered by either the plurality of lattice patterns or the conductive member.

11. The method of claim 10, wherein the static-electricity transmission electrode is formed in a same layer as pixel electrodes of the thin film transistor substrate.

12. The method of claim 10, wherein the static-electricity transmission electrode comprises one of indium-tin-oxide (ITO), indium-zinc-oxide (IZO), and indium-tin-zinc-oxide (ITZO).

13. The method of claim 10, further comprising:
forming a flexible circuit substrate to transfer external signals to the thin film transistor substrate; and
forming a connector to connect the flexible circuit substrate to the thin film transistor substrate.

14. The method of claim 13, wherein the static-electricity transmission electrode is formed to connect the flexible circuit substrate via the connector.

15. The method of claim 10, wherein the conductive member comprises silver (Ag).

16. The method of claim 10, wherein the plurality of lattice patterns is formed in a region of the static-electricity transmission electrode adjacent to the color filter substrate.

17. The method of claim 10, wherein the plurality of lattice patterns are formed to include:
a protrusion comprising a first height; and
an intaglio comprising a bottom layer with a thickness corresponding to a second height.

18. The method of claim 17, wherein the first height is greater than the second height.

* * * * *